United States Patent [19]

Yamazaki et al.

[11] Patent Number: 4,744,862

[45] Date of Patent: May 17, 1988

[54] MANUFACTURING METHODS FOR NONLINEAR SEMICONDUCTOR ELEMENT AND LIQUID CRYSTAL DISPLAY PANEL USING THE SAME

[75] Inventors: Shunpei Yamazaki; Akira Mase; Toshimitsu Konuma; Minoru Miyazaki; Mitsunori Sakama; Takashi Inushima, all of Tokyo, Japan

[73] Assignee: Semiconductor Energy Laboratory Co., Ltd., Kanagawa, Japan

[21] Appl. No.: 155

[22] Filed: Jan. 2, 1987

Related U.S. Application Data

[62] Division of Ser. No. 782,628, Oct. 1, 1985.

[30] Foreign Application Priority Data

Oct. 1, 1984 [JP] Japan .................. 59/206080
Oct. 1, 1984 [JP] Japan .................. 59/206081
Jan. 7, 1985 [JP] Japan .................. 60/000547

[51] Int. Cl.[4] ............... H01L 2/306; B44C 1/22; C03C 15/00; C23F 1/02
[52] U.S. Cl. .................. 156/652; 156/656; 156/657; 156/659.1; 156/662; 350/333; 357/58; 437/180; 437/228
[58] Field of Search ............... 357/58; 350/330, 332, 350/333, 336; 156/652, 656, 657, 659.1, 662; 437/180, 181, 189, 228

[56] References Cited

U.S. PATENT DOCUMENTS 4,331,758 5/1982 Luo .................. 156/656 X
4,654,117 3/1987 Aoki et al. .................. 156/662 X Primary Examiner—William A. Powell
Attorney, Agent, or Firm—Gerald J. Ferguson, Jr.; Michael P. Hoffman; Michael J. Foycik, Jr.

[57] ABSTRACT

A method of manufacturing a liquid crystal display panel including preparing a first substrate member by forming a first conductive layer serving as a first electrode on a first substrate having an insulating surface; forming a first non-single-crystal semiconductor layer laminate layer on the first substrate member where the forming of the first non-single-crystal semiconductor laminate member includes forming at least a first non-single-crystal semiconductor of P (or N) type on the substrate, forming an i-type second non-single-crystal semiconductor layer on the first non-single-crystal semiconductor layer, the i-type layer containing an additive selected from the group consisting of carbon, nitrogen, oxygen, boron, and mixtures thereof, and forming a third non-single-crystal semiconductor layer of P (or N) type on the i-type second non-single-crystal semiconductor layer; forming a second conductive layer serving as a second electrode in a pattern on the first non-single-crystal semiconductor layer laminate layer in opposing relation to the first conductive layer; selectively etching away the first non-single-crystal semiconductor layer laminate member through the patterned second conductive layer to obtain a second non-single-crystal semiconductor laminate member; preparing a second substrate member by forming on a second substrate an insulating surface and a third conductive layer; and filling liquid crystal in a gap defined by the first and second substrate members.

8 Claims, 12 Drawing Sheets

MANUFACTURING METHODS FOR NONLINEAR SEMICONDUCTOR ELEMENT AND LIQUID CRYSTAL DISPLAY PANEL USING THE SAME This is a divisional application of Ser. No. 782,628, filed Oct. 1, 1985.

BACKGROUND OF THE INVENTION

1. Field of the Invention

The present invention relates to a nonlinear semiconductor element having a diode characteristic and a liquid crystal display panel employing the same. The invention also pertains to methods for the manufacture of the nonlinear semiconductor element and the liquid crystal display panel.

2. Description of the Prior Art

Heretofore there has been proposed a display panel which employs m×n (where $n \geq 1$ and $m \geq 1$) liquid crystal display devices $D_{11}$ to $D_{1n}$, $D_{21}$ to $D_{2n}$, ... and $D_{m1}$ to $D_{mn}$.

In this display panel, a liquid crystal element $C_{ij}$ (where $I = 1, 2 \ldots m$; $j = 1, 2 \ldots n$) is connected via a nonlinear element $H_{ij}$ to a row line $x_i$ and a column line $Y_j$ at their intersection.

With such a display panel, an image display can be provided by driving the liquid crystal elements at the intersections of selected ones of row lines $x_1$ to $x_m$ and column lines $Y_1$ to $Y_n$ through the selected lines.

The conventional display panel employs, as the nonlinear element $H_{ij}$, insulated gate FET or n-i-n, n-i-p(or p$^-$)-i-p type nonlinear semiconductor element.

The manufacture of the insulated gate FET calls for many steps using as many as six to eight photo masks. Accordingly, the conventional display panel employing the insulated gate FETs as the nonlinear elements cannot be fabricated with high production yield, with ease and at low cost.

The nonlinear semiconductor element, as the nonlinear element $H_{ij}$, is easier to fabricate at lower cost than the insulated gate FET. But the V-I (voltage-current) characteristics of the conventional nonlinear element is poor in origin symmetry. On account of this, in the case of driving the liquid crystal element by AC (alternative current) power via the nonlinear element, transparency or nontransparency of the liquid crystal element differs during the positive half cycle and during the negative cycle of the AC power, flickering a display by the liquid crystal element.

Furthermore, the conventional nonlinear semiconductor element has such a V-I characteristic that current at the time of voltage being zero has a relatively large value which cannot be neglected. That is to say, the nonlinear semiconductor element is accompanied by an appreciable amount of leakage current. Accordingly, even when the liquid crystal element is not driven (i.e. in the case where the power source is connected to the liquid crystal element but the power source voltage is zero) the leakage current is charged in the liquid crystal element, making it transparency or nontransparency lower though slightly than in the case of the power source being disconnected.

SUMMARY OF THE INVENTION

It is therefore an object of the present invention to provide a novel nonlinear semiconductor element which has a V-I characteristics of excellent origin symmetry and a liquid crystal display panel which employs such nonlinear semiconductor element to overcome the abovesaid defects of the prior art.

Another object of the present invention is to provide novel methods for the manufacture of such nonlinear semiconductor element and the liquid crystal display panel.

In accordance with an aspect of the present invention, the nonlinear semiconductor element has an n-i-n, n-i-p(or p$^-$)-i-n, or p-i-n(or n$^-$)-i-p type structure as is the case with the conventional nonlinear semiconductor element.

In the nonlinear semiconductor element of the present invention, however, the i-type semiconductor layer is intentionally doped with boron, or is intentionally contained carbon, nitrogen or oxygen, or is intentionally contain carbon, nitrogen or oxygen and is intentionally doped with boron.

The boron doped in the i-type semiconductor layer compensates for the n-type conductivity although the i-type layer is undoped with an n-type impurity in the case where it is formed of non-single-crystal semiconductor and is doped with hydrogen or halogen as a dangling bond neutralizer. In other words, the boron acts to make the i-type semiconductor layer more intrinsic. Moreover, when the nonlinear semiconductor element has the n-i-n type structure, the i-type semiconductor layer is formed on the first n-type semiconductor layer and the second n-type semiconductor layer is formed on the i-type semiconductor layer. When the second n-type semiconductor layer is formed on the i-type semiconductor layer, an n-type impurity contained in the first and second n-type semiconductor layers diffuses therefrom into the i-type semiconductor layer. The boron doped into the i-type semiconductor layer compensates for the n-type impurity having diffused into the i-type semiconductor layer, preventing the i-type semiconductor layer from becoming n or n$^-$-type in its peripheral portions adjoining the first and second n-type semiconductor layers. In the case where the nonlinear semiconductor element has the n-i-p(or p$^-$)-i-n type structure, the boron doped in the first and second i-type semiconductor layers acts to make the first and second i-type semiconductor layers more intrinsic and to prevent them from becoming n-type in their peripheral portions adjoining the first and second n-type semiconductor layers during the formation of the nonlinear element.

By virtue of the abovesaid action of the boron doped into the i-type semiconductor layer, the nonlinear semiconductor element of the present invention has such a V-I characteristics that current at the time of voltage being zero has a far smaller value than in the case of the conventional nonlinear semiconductor element. Moreover, the abovesaid action of the boron that prevents the i-type semiconductor layer from becoming n-type provides excellent origin symmetry in the V-I characteristics of the nonlinear semiconductor element of the present invention.

Accordingly, the nonlinear semiconductor element of the present invention has excellent diode characteristics.

The liquid crystal display panel of the present invention comprises liquid crystal display devices or cells, each including the nonlinear semiconductor element described above and a liquid crystal element connected in series therewith. With such a liquid crystal display panel of the present invention, since the nonlinear semiconductor element has the above-mentioned excellent diode characteristics, the display by the liquid crystal element, driven by AC power, is almost free from flickering which depends upon the transparency or nontransparency of the liquid crystal element during the positive and negative half cycles of the AC power. Furthermore, when the liquid crystal element is not driven (i.e. in the case where a power source is connected to the liquid crystal element but the power source voltage is zero), the transparency or nontransparency lower though slightly than in the case of the power source being disconnected. Accordingly, an image display which employs m×n such liquid crystal display devices, as is the case with the aforementioned conventional display panel, provides a display image which is far easier to see, clearer and sharper in contrast than a display image obtainable with the prior art display.

Such a nonlinear semiconductor element which has the aforementioned excellent diode characteristic can be produced by the manufacturing method of the present invention which includes the following steps (a) to (d):

(a) A first conductive layer, which will ultimately serve as a first electrode, is formed on a substrate having an insulating surface.

(b) A first non-single-crystal semiconductor layer laminate member is formed on the substrate so that it continuously extends on the first conductive layer.

In this instance, the first non-single-crystal semiconductor layer laminate member includes at least a p (or n)-type first non-single-crystal semiconductor formed on the substrate and extending on the first conductive layer, an i-type second non-single-crystal semiconductor layer formed on the first non-single-crystal semiconductor layer and doped with boron and a p (or n)-type third non-single-crystal semiconductor layer formed on or over the i-type second non-single-crystal semiconductor layer. The p (or n)-type non-single-crystal semiconductor layer is formed by a CVD method in a first reaction chamber. The i-type second non-single-crystal semiconductor layer is formed similarly by the CVD method but in a second reaction chamber. The p (or n)-type third non-single-crystal semiconductor layer is formed by the CVD method in the first reaction chamber.

(c) A second conductive layer, which will ultimately serve as a second electrode, is formed in a required pattern on the first non-single-crystal semiconductor layer laminate member in opposing relation to the first conductive layer.

(d) The first non-single-crystal semiconductor layer laminate member is selectively etched away through the patterned second conductive layer, obtaining a second non-single-crystal semiconductor laminate member.

According to such a method of the present invention, the i-type second non-single-crystal semiconductor layer of the first non-single-crystal semiconductor laminate member is formed while being doped with boron in the second reaction chamber. The patterned second non-single-crystal semiconductor laminate member is obtained by selective etching of the first non-single-crystal semiconductor laminate member using the patterned second conductive layer as a mask. Therefore, the nonlinear semiconductor element having the aforementioned excellent diode characteristic can easily be obtained.

Moreover, according to the present invention, the liquid crystal display panel which has the aforesaid excellent features can be produced by a manufacturing method including the following steps (a) to (f):

(a) A first substrate member is prepared by forming a first conductive layer serving as a first electrode on a first substrate having an insulating surface;

(b) A first non-single-crystal semiconductor layer laminate layer is formed on the first substrate member which continuously extends on the first conductive layer. The first non-single-crystal semiconductor laminate member includes at least a p (or n)-type first non-single-crystal semiconductor formed on the substrate and extending on the first conductive layer, an i-type second non-single-crystal semiconductor layer formed on the first non-single-crystal semiconductor layer and doped with boron and a p (or n)-type third non-single-crystal semiconductor layer formed on or over the i-type second non-single-crystal semiconductor layer. The p (or n)-type non-single-crystal semiconductor layer is formed by a CVD method in a first reaction chamber. The i-type second non-single-crystal semiconductor layer is formed similarly by the CVD method but in a second reaction chamber. The p (or n)-type third non-single-crystal semiconductor layer is formed by the CVD method in the first reaction chamber;

(c) A second conductive layer, wherein will ultimately serve as a second electrode, is formed in a liquid pattern on the first non-single-crystal semiconductor layer laminate layer in opposing relation to the first conductive layer;

(d) The first non-single-crystal semiconductor layer laminate member is selectively etched away through the patterned second conductive layer, obtaining a second non-single-crystal semiconductor laminate member;

(e) A second substrate member is formed by forming, on a second substrate having an insulating surface, a third conductive layer. (f) Liquid crystal is filled in a gap defined by the first and second substrate members.

With such a manufacturing method of the present invention, it is possible to easily produce the liquid crystal display element which has the aforementioned excellent features.

Other objects, features and advantages of the present invention will become more fully apparent from the following detailed description taken in conjunction with the accompanying drawings.

DESCRIPTION OF THE PREFERRED EMBODIMENTS

FIGS. 1 to 5 illustrate an embodiment of the liquid crystal display panel of the present invention, in which a substrate 1 has an insulating surface. The substrate 1 is transparent and formed of, for instance, alkaline free glass.

The substrate 1 has arranged thereon in a matrix form $m \times n$ (which $m \geq 1$ and $n \geq 1$) conductive layers $C_{11}$ to $C_{1n}$, $C_{21}$ to $C_{2n}$, $C_{31}$ to $C_{3n}$, ... and $C_{m1}$ to $C_{mn}$.

The conductive layer $C_{ij}$ (where $i=1, 2, \ldots m$ and $j=1, 2, \ldots n$) is transparent and has, for example, a relatively large square part $2a$ and a relatively small rectangular part $2b$ which extends from one side of the part $2a$ on the side of the conductive layer $C_{(i-1)j}$ toward it and which is, for example, 100 μm wide and 150 μm long. On the part $2b$ of the conductive layer $C_{ij}$ is formed a square conductive layer 3 which extends across the part $2b$ in its widthwise direction and which measures, for example, $100 \times 100$ μm. The conductive layer 3 is formed of, for instance, chromium and is nontransparent.

Furthermore, the substrate 1 has formed thereon, for example, a 100 μm wide non-single-crystal semiconductive layer laminate member $Q_i$ which continuously extends in the row direction on the conductive layer 3 formed on the parts $2b$ of the conductive layers $C_{i1}$ to $C_{in}$ (or $C_{(i+1)1}$ to $C_{(i+1)n}$ (where let it be assumed that $(i+1)$ does not take the value of $(m+1)$ and $(i-1)$ does not take the value of zero).

The non-single-crystal semiconductor laminate layer $Q_i$ has an n-i-n type structure composed of an n-type layer, an i-type layer and an n-type layer, an n-i-p (or p⁻)-i-n type structure composed of an n-type layer, an i-type layer, a p(or p⁻)-type layer, an i-type layer and an n-type layer, a p-i-p type structure composed of a p-type layer, an i-type layer and a p-type layer, or a p-i-n(or n⁻)-i-p type structure composed of a p-type layer, an i-type layer, an n(or n⁻)-type layer, an i-type layer and a p-type layer. But FIGS. 1 to 5 show the case where the non-single-crystal semiconductor laminate member $Q_i$ has the n-i-n type structure. For the sake of brevity, the following description will be made in connection with the case where the non-single-crystal semiconductor laminate member $Q_i$ has the n-i-n type structure.

Figure 1:
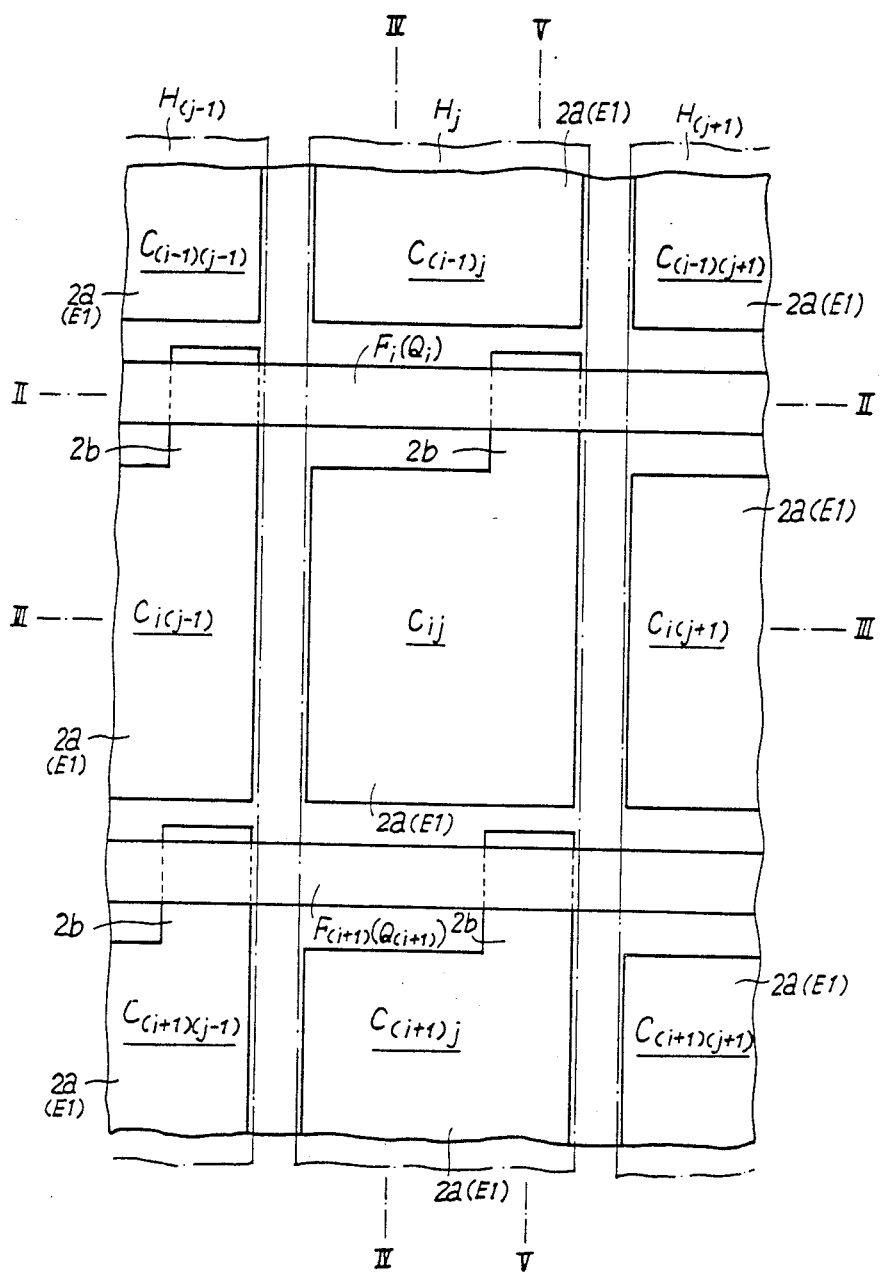
FIG. 1 is a plan view schematically illustrating an embodiment of the liquid crystal display panel of the present invention.
Figure 2:
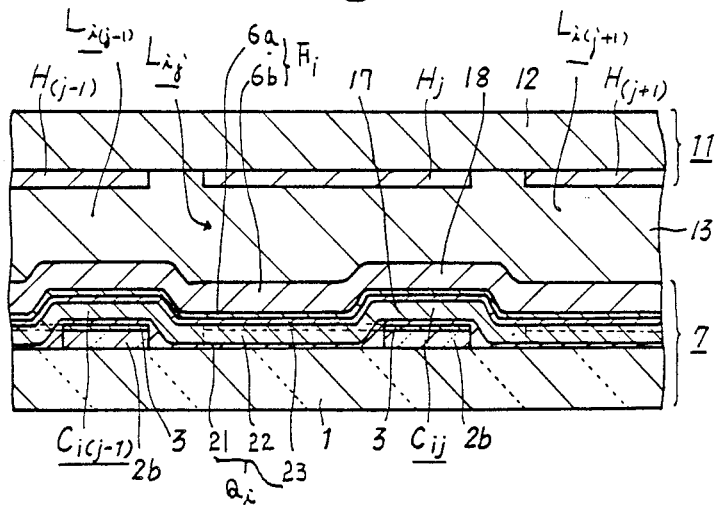
FIGS. 2, 3, 4 and 5 are sectional views respectively taken on the lines II—II, III—III, IV—IV and V—V in FIG. 1.
Figure 3:
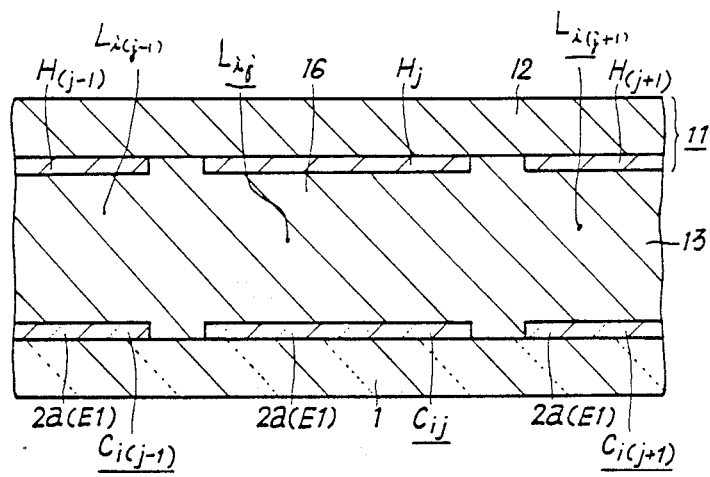
Figure 4:
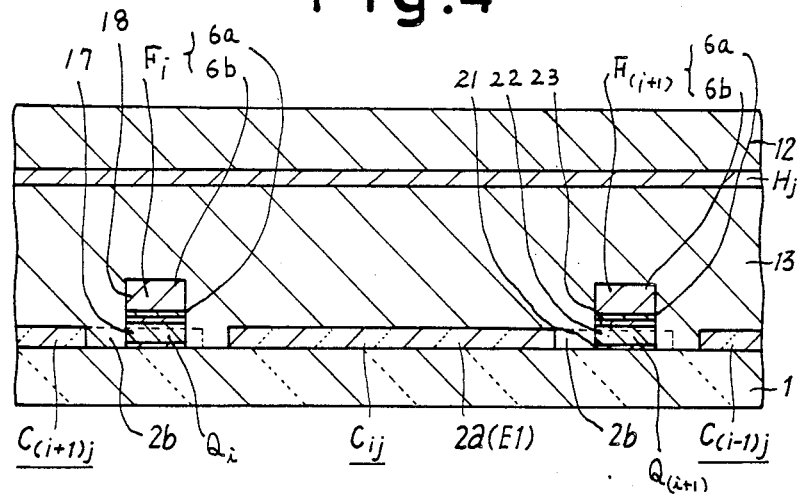
Figure 5:
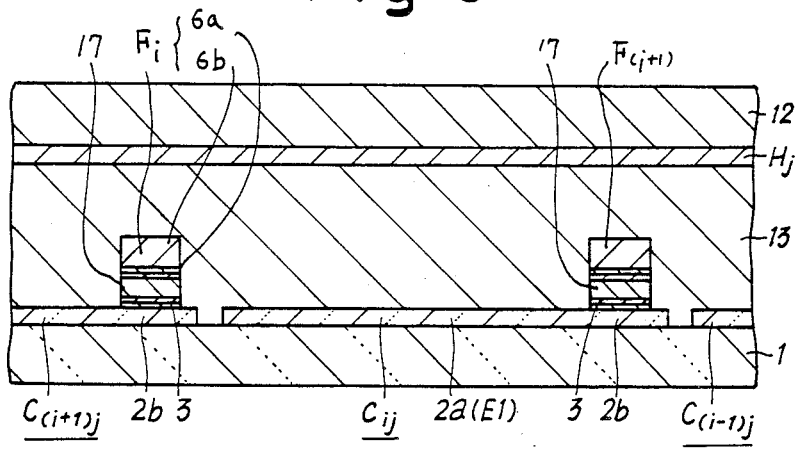
Figure 6A:
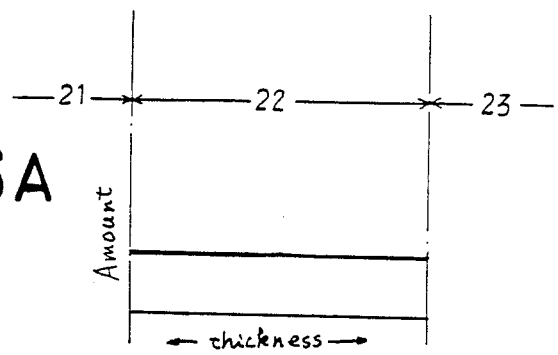
FIGS. 6A, 6B and 6C are graphs showing the distribution of the carbon, nitrogen or oxygen content in an i-type non-single-crystal semiconductor layer of a non-single-crystal semiconductor laminate member of a nonlinear semiconductor element used in the liquid crystal display panel shown in FIGS. 1 to 5.
Figure 6B:
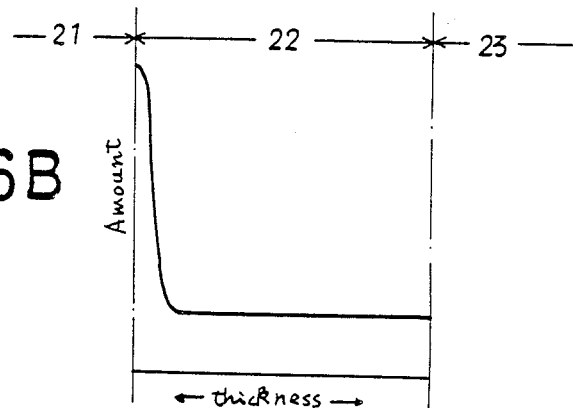
Figure 6C:
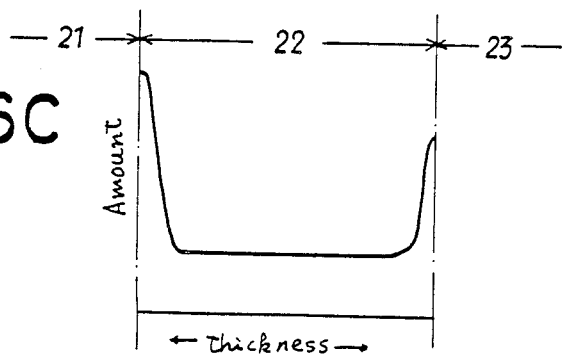

The non-single-crystal semiconductor laminate member $Q_i$ has an n-type non-single-crystal silicon layer 21 formed on the substrate 1, an i-type non-single-crystal semiconductor layer 22 formed on the layer 21 and an n-type non-single-crystal silicon layer 23 formed on the layer 22. The layer 22 is formed principally of silicon but contains carbon (C), nitrogen (N) or oxygen (O) in an amount of 1/10 or less relative to the silicon, and hence is formed of non-single-crystal semiconductor expressed by $Si_xC_{1-x}$ (where $0 < x < 1$). In this instance, the carbon, nitrogen or oxygen may be distributed substantially uniformly in the layer 22 thickwise thereof, as shown in FIG. 6A. It is preferable, however, that the carbon, nitrogen or oxygen be distributed in such a manner that its content in the layer 22 is larger in the region adjoining the layer 21 than in the other regions, as shown in FIG. 6B, or in the regions adjoining the layers 21 and 23 than in the other regions, as shown in FIG. 6C.

The non-single-crystal semiconductor laminate layer $Q_i$ is covered over the entire area of its surface with a conductive layer $F_i$. The conductive layer $F_i$ is composed of a nontransparent layer $6a$ formed of, for instance, chromium and overlying the semiconductor layer $Q_i$ and a conductive layer $6b$ as of aluminum formed on the layer $6a$.

The conductive layers $C_{11}$ to $C_{1n}$, $C_{21}$ to $C_{2n}$, $C_{31}$ to $C_{3n}$ ... and $C_{m1}$ to $C_{mn}$, the non-single-crystal semiconductor layers $Q_1$ to $Q_n$ and the conductive layer $F_i$ make up a substrate member 7.

The substrate member 7 is formed, for example, as follows:

A first layer which will ultimately form the conductive layers $C_{11}$ to $C_{mn}$ and $D_1$ to $D_n$, and a second conductive layer, which will ultimately form the conductive layers 3, are deposited in that order on the substrate 1 through a known method, for instance, a sputtering or electron beam evaporation process.

Next, the first and second conductive layers are subjected to a known pattern process using a first mask, providing the conductive layers $C_{11}$ to $C_{mn}$, $m \times n$ third conductive layers of the same pattern as the overlaying conductive layers $C_{11}$ to $C_{mn}$.

Next, the third conductive layer is patterned by a known method using a second mask into the conductive layers 3 on the conductive layers $C_{11}$ to $C_{mn}$.

Next, a non-single crystal semiconductor layer laminate member, which will ultimately form the non-single-crystal semiconductor laminate members $Q_1$ to $Q_n$, is deposited by a known method, for example, a plasma CVD or photo CVD method on the substrate 1, in a manner to continuously extend covering the conductive layers $C_{11}$ to $C_{mn}$ and the conductive layer 3.

Figure 10:
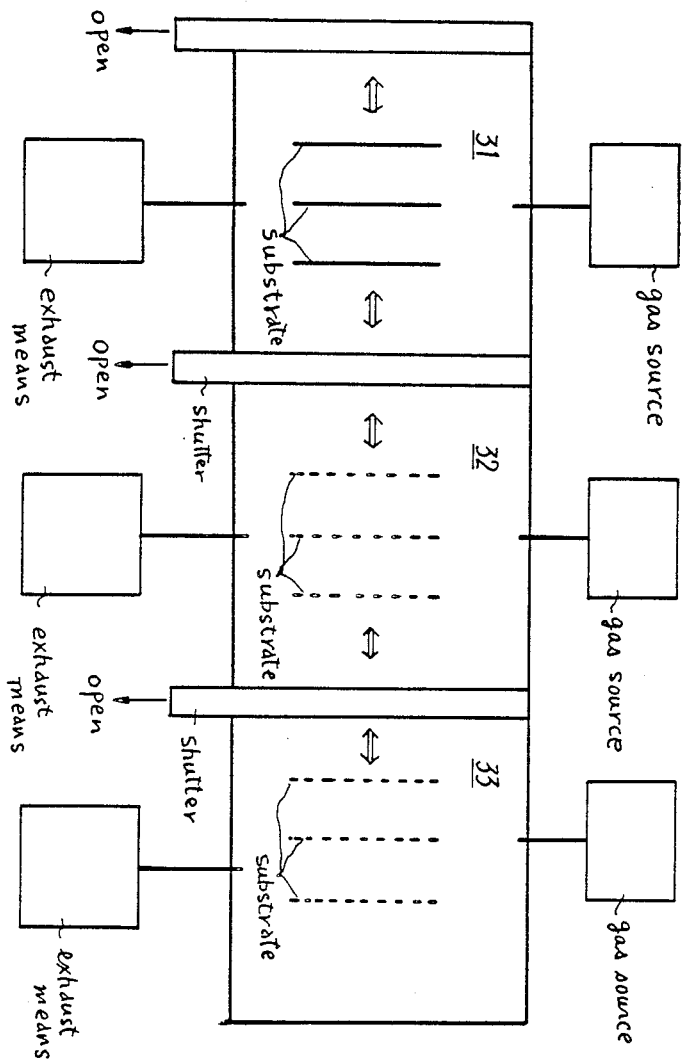
FIG. 10 is a diagram for explaining the manufacture of the liquid crystal display panel by the method of the present invention.
Figure 11:
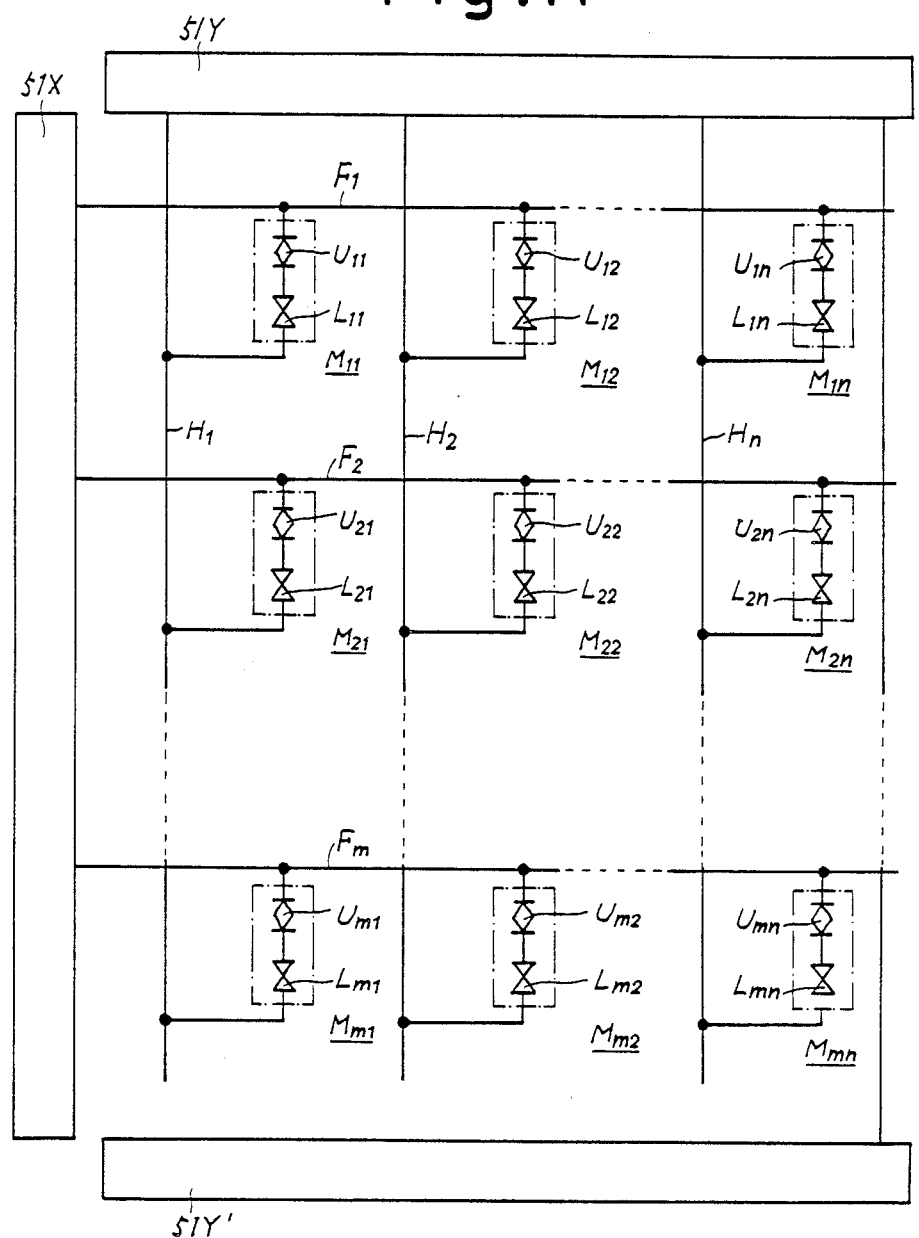
FIG. 11 is an electrical connection diagram of the liquid crystal display panel of the present invention shown in FIGS. 1 to 5.
Figure 12:
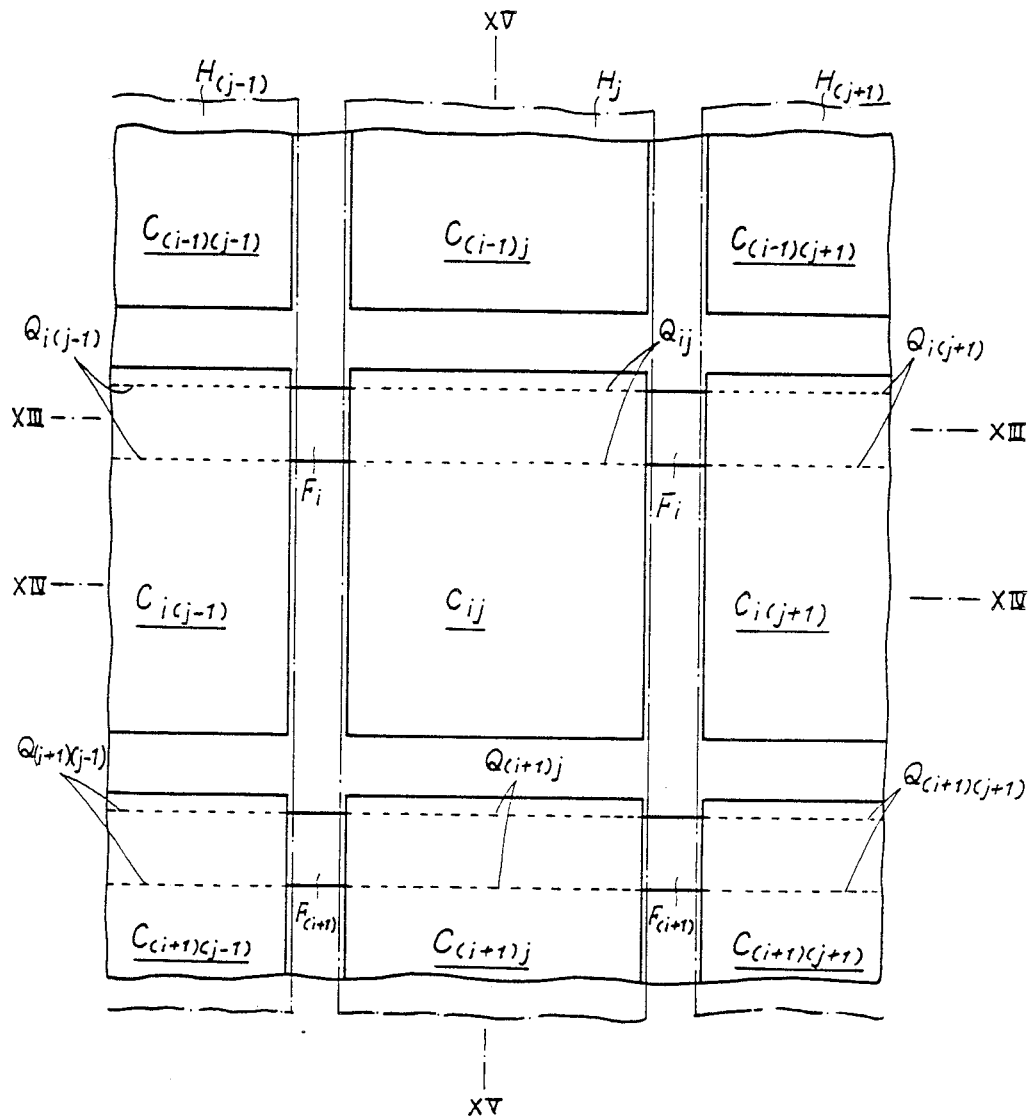
FIG. 12 is a plan view illustrating another embodiment of the liquid crystal display panel of the present invention.
Figure 13:
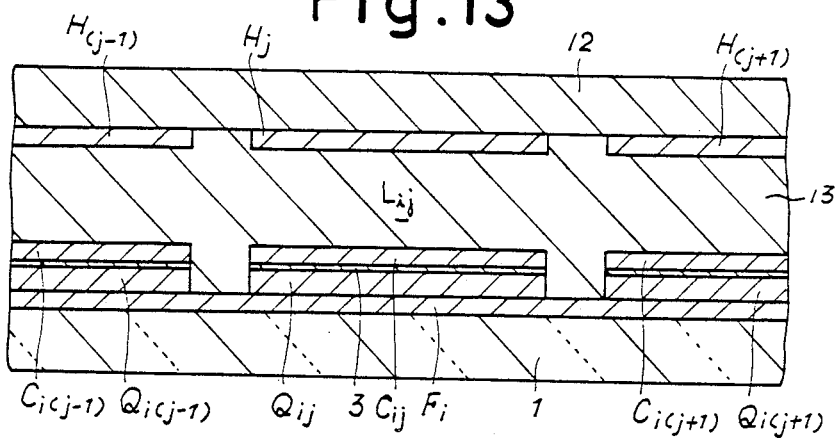
FIGS. 13, 14 and 15 are sectional views respectively taken on the lines XIII—XIII, XIV—XIV and XV—XV in FIG. 12.
Figure 14:
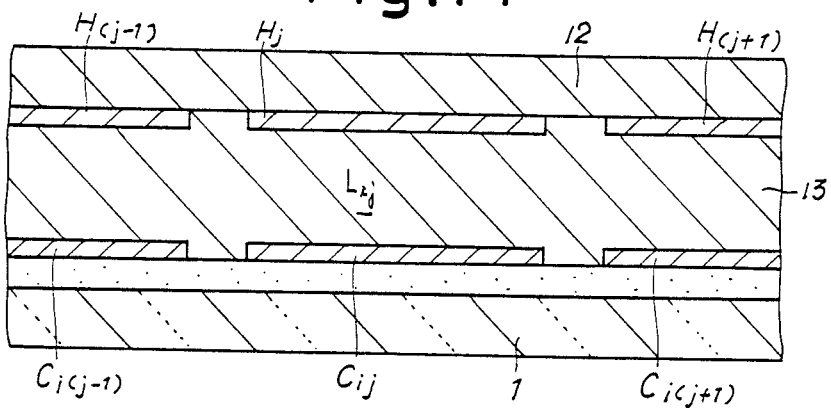
Figure 15:
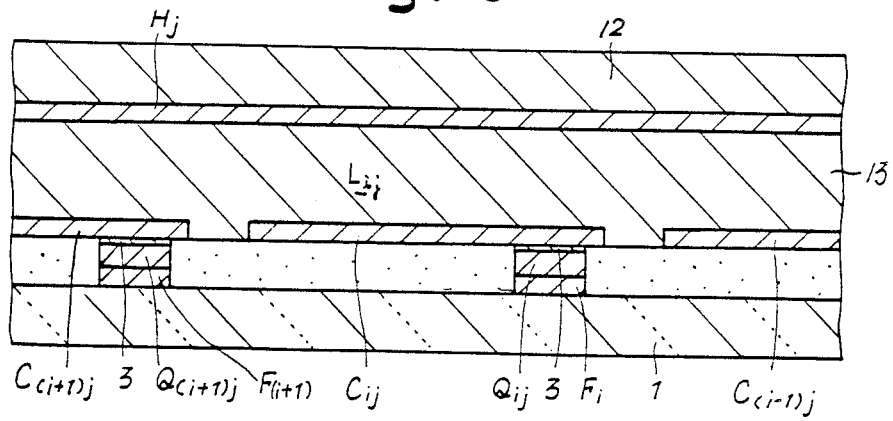

In my experiment, as shown in FIG. 10, the substrate member 7 was loaded through a loading and unloading chamber 31 into a reaction chamber 32, wherein a glow discharge was produced over the substrate 1 at a high frequency of 13.56 MHz in an atmosphere containing silane SiH₄, phosphine PH₃ and hydrogen, with the substrate temperature held in the range of 200° to 250° C. As a result of this, an n-type microcrystalline silicon layer, which had a conductivity of $10^{-2}$ to $10^2$ $(\Omega cm)^{-1}$ and contained hydrogen as a recombination center neutralizer, was deposited 300 to 1000 Å thick on the substrate 1. Next, the substrate member 7 was moved from the reaction chamber 32 into the next reaction chamber 33, wherein a gas mixture of silane $Si_mH_{2m+2}$ (where m=1, 2, 3, ...) (for example, $SiH_4$) and methyl silane $SiH_n(CH_3)_{4-n}$ (where n=1, 2, 3) was discharged into a plasma, by which an i-type non-single-crystal silicon layer of $Si_xC_{1-x}$ was deposited 0.2 to 1 μm thick on the n-type layer.

After this, the substrate member 7 was returned from the reaction chamber 33 to the reaction chamber 32, wherein another n-type layer similar to the above n-type layer was deposited by the same method on the i-type non-single-crystal silicon layer, thus obtaining the laminate member having the n-i-n type structure.

After the formation of the non-single-crystal semiconductor layer laminate member, a fifth conductive layer which would ultimately form the conductive layer 6a and a sixth conductive layer which would ultimately for the conductive layer 6b were deposited in that order on the semiconductor laminate member through, for instance, the electron beam evaporation or sputtering method.

Next, the fifth and sixth conductive layers and the non-single-crystal semiconductor layer laminate member are patterned by a known method through a third mask into the conductive layers $F_1$ to $F_m$ respectively made up of the non-single-crystal semiconductor layer laminate members $Q_1$ to $Q_n$ and the conductive layers 6a and 6b.

Another substrate member 11, which is different from the aforementioned substrate member 7, is produced. The substrate member 11 has, on a substrate 12 corresponding to the substrate 1, a conductive layer $H_j$ which corresponds to the column of the conductive layers $C_{1j}$ to $C_{mj}$ and is substantially equal in width to them. The conductive layer $H_j$ can be obtained by forming a seventh conductive layer through a known method on the substrate 12 and then patterning the seventh conductive layer through a third mask.

The substrate member 11 is disposed upside down by a suitable support means (not shown) in opposing relation to the top of the substrate member 7 in parallel thereto. In this instance, the columns of the conductive layers $C_{1j}$ to $C_{mj}$ of the substrate member 7 and the conductive layer $H_j$ of the substrate member 11 are held face-to face with each other.

A space defined by the substrate members 7 and 11 is filled with liquid crystal 13.

In the structure described above in conjunction with FIGS. 1 through 5, the part 2a of the conductive layer $C_{ij}$ on the substrate 1, a part 14 of the conductive layer $H_j$ on the substrate 12 which is face-to-face with the part 2a and a part 16 of the liquid crystal 13 between the parts 2a and 14 constitute a liquid crystal element $L_{ij}$ which employs the parts 12a and 14 as its electrodes E1 and E2, respectively. When a low voltage is applied across the electrodes E1 and E2, the liquid crystal element $L_{ij}$ remains opaque, but when a high voltage is applied, it becomes transparent.

Figure 8:
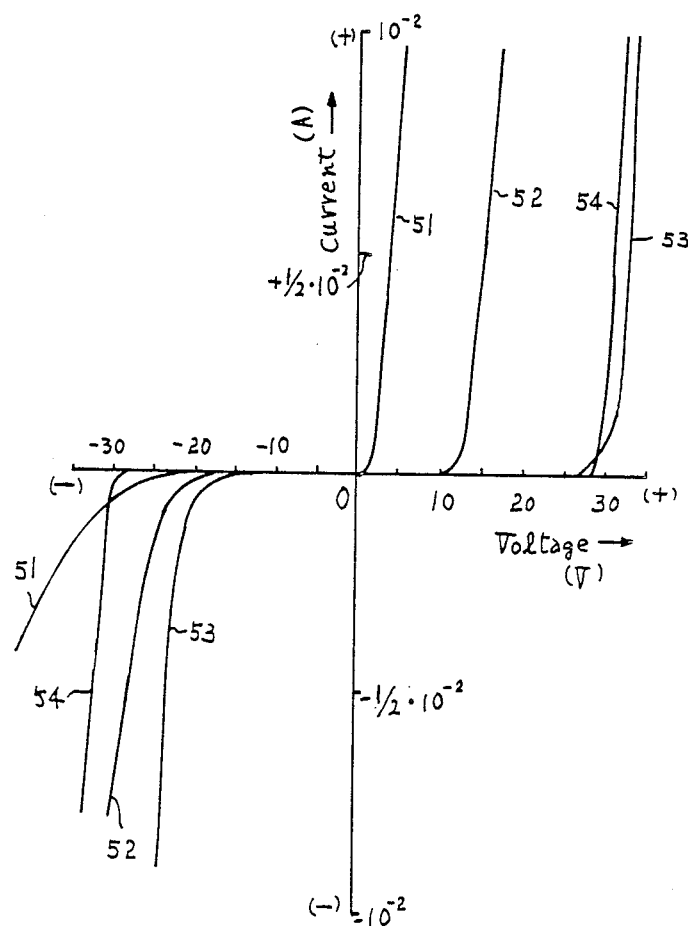
FIG. 8 is a series of graphshowing the voltage (V)-current(I) characteristics of the nonlinear semiconductor element used in the liquid crystal display panel of the present invention depicted in FIGS. 1 to 5, in comparison with the V-I characteristics of a conventional nonlinear semiconductor element.

The conductive layer 3 overlying the conductive layer $C_{ij}$, a part 17 of the non-single-crystal semiconductor layer laminate member $Q_i$ overlying the conductive layer 3 and a part 18 of the conductive layer $F_i$ overlying the part 17 constitute a nonlinear semiconductor element $U_{ij}$ which employs the parts 3 and 17 as its electrodes $E_3$ and $E_4$, respectively. The element $U_{ij}$ presents such a nonlinear voltage(V)-current(A) characteristic curves 52, 53 and 54 as shown in FIG. 8. The element $U_{ij}$ has an offset voltage which is intermediate between the voltage that makes the liquid crystal element $L_{ij}$ transparent and nontransparent, respectively. The curve 51 shows the V-I characteristic in the case where the i-type layer 22 of the laminate member $Q_{ij}$ of the element $U_{ij}$ is formed of silicon as in the prior art, not $Si_xC_{1-x}$. A is evident from comparison with the curve 51, the element $U_{ij}$ of the present invention has excellent origin-symmetry in its V-I characteristics, as compared with the conventional nonlinear element. Furthermore, the element $U_{ij}$ of the present invention has such a V-I characteristic that the value of current at the time of zero voltage is closer to zero than in the case of the conventional nonlinear element (indicated by the curve 51), as indicated by the curves 53 and 54 in FIG. 9.

Figure 7A:
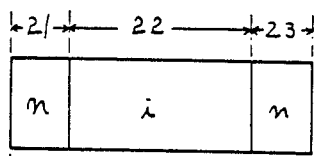
FIGS. 7A to 7D are diagrams showing the energy bands of the nonlinear semiconductor element for explaining its operation used in the liquid crystal display panel depicted in FIGS. 1 to 5.
Figure 7B:
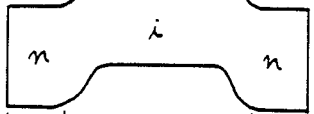
Figure 7C:
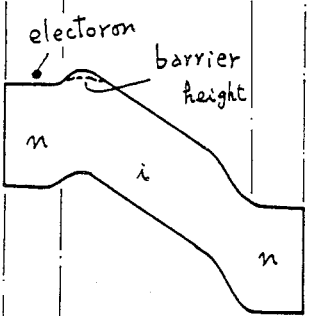
Figure 7D:
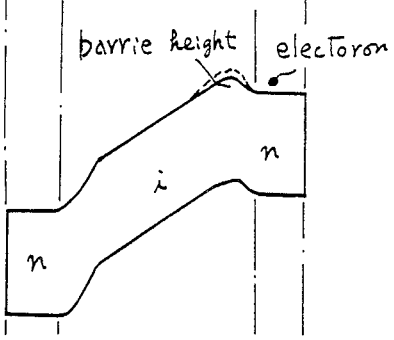
Figure 9:
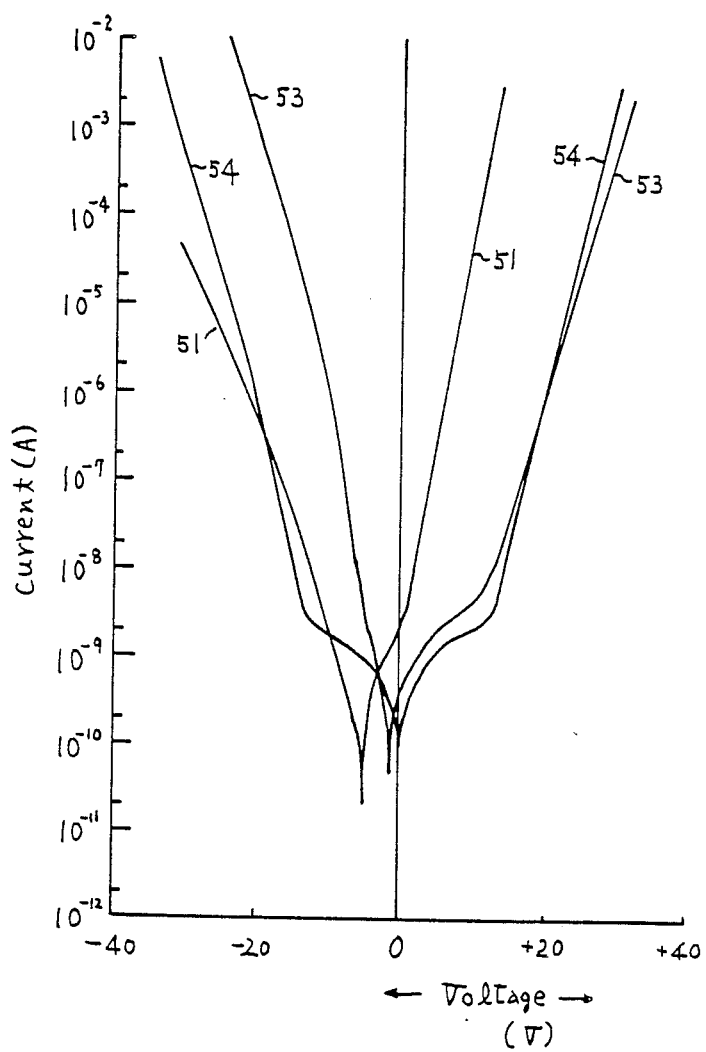
FIG. 9 is a graph showing a part of the V-I characteristics depicted in FIG. 8.

The reason for which the element $U_{ij}$ presents such a nonlinear characteristics as shown in FIGS. 8 and 9 is as follows: When no voltage is applied across the electrodes E3 and E4, the energy band structure of the diode $U_{ij}$ of the construction depicted in FIG. 7A becomes as indicated by the full line in FIG. 7B; When a voltage is applied which makes the electrode E4 positive relative to the electrode E3, the energy band structure becomes as indicated by the full line in FIG. 7C; and a voltage is applied which makes the electrode E3 positive relative to the electrode E4, the energy band structure becomes as indicated by the full line in FIG. 7D. In the case of the conventional nonlinear semiconductor element, the energy band structure corresponding to those indicated by the full lines in FIGS. 7B, 7C and 7D are indicated by the broken lines in FIGS. 9B, 9C and 9D. It must be noted here that in the case of the element $U_{ij}$ of the present invention, barriers against carriers (electrons) in the layer 22 as viewed from the layers 21 and 23, respectively, in FIG. 7B have substantially the same height, whereas in the case of the conventional element, such barriers have different heights. Moreover, the barrier height in the layer 22, as viewed from the layer 21 in FIG. 7C, and the barrier height in the layer 22, as viewed from the layer 23 in FIG. 7D, are nearly equal to each other. In the prior art element, however, such barriers differ in height.

The liquid crystal element $L_{ij}$ and the nonlinear semiconductor element $U_{ij}$ have their electrodes E1 and E3 electrically connected via the conductive layer $C_{ij}$, and hence are connected in series with each other, making up a liquid crystal display device $M_{ij}$.

According to the arrangement described above with respect to FIGS. 1 through 5, the electrodes E2 of the liquid crystal elements $L_{1j}$ to $L_{mj}$ of the liquid crystal display devices $M_{i1}$ to $M_{in}$ are connected to the conductive layer $H_j$ acting as a column line and the electrodes $E_3$ of the nonlinear element $U_{i1}$ to $U_{in}$ serving as nonlinear elements are connected to the conductive layer $F_i$ serving as a row line.

Therefore, according to the arrangement described above in connection with FIGS. 1 to 5, since the liquid crystal element $L_{ij}$ can be controlled to be transparent or nontransparent by applying, through use of row and column decoders 51X and 51Y, across the liquid crystal display device $M_{ij}$ via the conductive layers $F_i$ and $H_j$ a drive signal an image display can be provided.

FIG. 12 to 15 illustrate another embodiment of the liquid crystal display panel of the present invention. In FIGS. 12 to 15 like parts corresponding to those in FIGS. 1 to 5 are identified by the same reference numerals and no detailed description will be given of them.

The liquid crystal display panel shown in FIGS. 12 to 15 has the same construction as depicted in FIGS. 1 to 5 except the following points: The conductive layer $F_i$, which is formed on the semiconductor laminate member $Q_i$ in FIGS. 1 to 5, is formed on the substrate 1 just under the laminate member $Q_i$. The conductive layer $C_{ij}$, which is formed on the substrate 1 just under the laminate member $Q_i$ in FIGS. 1 to 5, extends on the laminate member $Q_i$ correspondingly. In this case, however, the conductive layer $C_{ij}$, which has the small rectangular part 2b in FIGS. 1 to 5, has no such part 2b. Furthermore, the i-type layer 22, which is formed of $Si_xC_{1-x}$ in FIGS. 1 to 5, is formed of silicon and doped with boron.

Such as a liquid crystal display panel can be manufactured by the same manufacturing steps as described previously with respect to FIGS. 1 to 5, except that the i-type layer 22 of the semiconductor laminate member $Q_{ij}$ of the nonlinear element $U_{ij}$ is formed through use of gas mixture of, for instance, silane and diborane ($B_2H_6$) instead of using the gas mixture of silane and methyl silane in the case of FIGS. 1 to 5.

Figure 16:
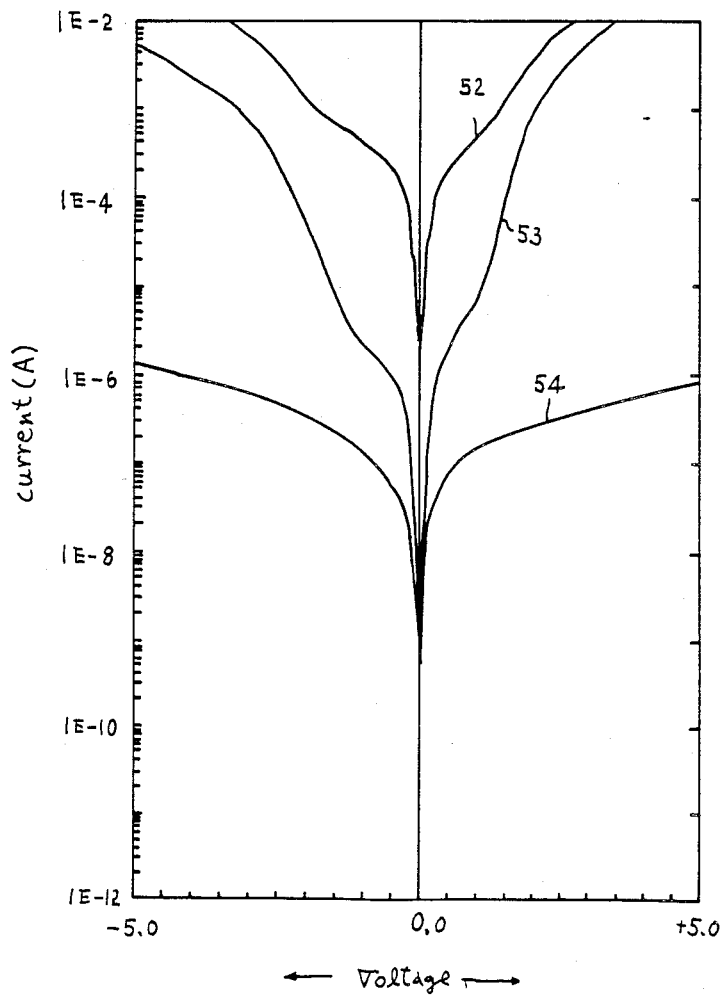
FIG. 16 is a graph showing the V-I characteristics of the nonlinear semiconductor element used in the liquid crystal display panel depicted in FIGS. 12 to 15.

Accordingly to the liquid crystal display panel depicted in FIGS. 12 to 15, the nonlinear element $U_{ij}$ exhibits such a V-I characteristic that has origin-symmetry, as indicated by the curves 52, 53 and 54 in FIG. 16 corresponding to FIG. 9 and has a sufficiently small current value when voltage is zero. The liquid crystal display shown in FIGS. 12 to 15, though not described in detail, is also able to display an image as is the case with the example shown in FIGS. 1 to 5.

It will be apparent that the above embodiment should be construed as merely illustrative of the present invention and should not be construed as limiting the invention specifically thereto and that various modifications and variations may be effected without departing from the scope of the novel concepts of the invention.

What is claimed is:

1. A method of manufacturing a nonlinear semiconductor element comprising the steps of:
   (a) forming a first conductive layer, which will ultimately serve as a first electrode, on a substrate having an insulating surface;
   (b) forming a first non-single crystal semiconductor layer laminate member on the substrate so that it continuously extends on the first conductive layer, where the forming of the first non-single-crystal semiconductor layer laminate member includes the substeps of:
      (1) forming at least a first non-single-crystal semiconductor of a predetermined conductivity type on the substrate and extending on the first conductive layer,
      (2) forming an i-type second non-single-crystal semiconductor layer on the first non-single-crystal semiconductor layer, said i-type layer containing an additive selected from the group consisting of carbon, nitrogen, oxygen, boron, and mixtures thereof, and
      (3) forming a third non-single-crystal semiconductor layer of said predetermined conductivity type on the i-type second non-single-crystal semiconductor layer;
   (c) forming a second conductive layer, which will ultimately serve as a second electrode, in a predetermined pattern on the first non-single-crystal semiconductor layer laminate member in opposing relation to the first conductive layer; and
   (d) selectively etching away the first non-single-crystal semiconductor layer laminate member through the patterned second conductive layer to obtain a second non-single-crystal semiconductor laminate member.

2. A method as in claim 1 wherein said predetermined conductivity type of said first and third non-single-crystal semiconductor layers is P-type.

3. A method as in claim 1 where said predetermined conductivity type of said first and third non-single-crystal semiconductor layers is N-type.

4. A method as in claim 3 including doping said i-type layer with said boron.

5. A method of manufacturing a liquid crystal display panel comprising the steps of:
   (a) preparing a first substrate member by forming a first conductive layer serving as a first electrode on a first substrate having an insulating surface;
   (b) forming a first non-single-crystal semiconductor layer laminate layer on the first substrate member which continuously extends on the first conductive layer, where the forming of the first non-single-crystal semiconductor laminate member includes the substeps of:
      (1) forming at least a first non-single-crystal semiconductor of a predetermined conductivity type on the substrate and extending on the first conductive layer,
      (2) forming an i-type second non-single-crystal semiconductor layer on the first non-single-crystal semiconductor layer, said i-type layer containing an additive selected from the group consisting of carbon, nitrogen, oxygen, boron, and mixtures thereof, and
      (3) forming a third non-single-crystal semiconductor layer of said predetermined conductivity type on the i-type second non-single-crystal semiconductor layer;
   (c) forming a second conductive layer, which will ultimately serve as a second electrode, in a liquid pattern on the first non-single-crystal semiconductor layer laminate layer in opposing relation to the first conductive layer;
   (d) selectively etching away the first non-single-crystal semiconductor layer laminate member through the patterned second conductive layer to obtain a second non-single-crystal semiconductor laminate member;
   (e) preparing a second substrate member by forming on a second substrate an insulating surface and a third conductive layer;
   (f) positioning said first and second substrate members with respect to each other so that a gap is present therebetween; and
   (g) filling liquid crystal in said gap defined by the first and second substrate members.

6. A method as in claim 5 where said predetermined conductivity type of said first and third non-single-crystal semiconductor layers is P-type.

7. A method as in claim 5 where said predetermined conductivity type of said first and third non-single-crystal semiconductor layers is N-type.

8. A method as in claim 5 including doping said i-type layer with said boron.

* * * * *